(12) United States Patent
Martin et al.

(10) Patent No.: US 6,623,861 B2
(45) Date of Patent: Sep. 23, 2003

(54) MULTILAYER PLASTIC SUBSTRATES

(75) Inventors: Peter M. Martin, Kennewick, WA (US); Gordon L. Graff, West Richland, WA (US); Mark E. Gross, Pasco, WA (US); Michael G. Hall, West Richland, WA (US); Eric S. Mast, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 0 days.

(21) Appl. No.: 09/835,768

(22) Filed: Apr. 16, 2001

(65) Prior Publication Data

US 2002/0150745 A1 Oct. 17, 2002

(51) Int. Cl.$^7$ ............................................... B32B 27/36
(52) U.S. Cl. ..................... 428/412; 428/411.1; 428/480; 428/473.5; 428/474.4; 428/421; 430/58
(58) Field of Search ............................. 428/480, 473.5, 428/474.4, 412, 411.1, 421; 430/58

(56) References Cited

U.S. PATENT DOCUMENTS

| | | | |
|---|---|---|---|
| 3,475,307 A | 10/1969 | Knox et al. | |
| 3,607,365 A | 9/1971 | Lindlof | |
| 4,098,965 A | 7/1978 | Kinsman | |
| 4,283,482 A | 8/1981 | Hattori et al. | |

(List continued on next page.)

FOREIGN PATENT DOCUMENTS

| | | |
|---|---|---|
| BE | 704 297 | 2/1968 |
| DE | 19603746 | 4/1997 |
| EP | 0 299 753 | 1/1989 |
| EP | 0 340 935 | 11/1989 |

(List continued on next page.)

OTHER PUBLICATIONS

Shi, M.K., et al., Plasma treatment of PET and acrylic coating surfaces–I. In situ XPS measurements, Journal of Adhesion Science and Technology, Mar. 2000, 14(12), pp. 1–28.

Shi, M.K., et al., In situ and real–time monitoring of plasma–induced etching PET and acrylic films, Plasmas and Polymers, Dec. 1999, 4(4), pp. 1–25.

Affinito, J.D., et al., Vacuum Deposited Conductive Polymer Films, The Eleventh International Conference on Vacuum Web Coating, no earlier than Feb. 1998, pp. 200–213.

Mahon, J.K., et al., Requirements of Flexible Substrates for Organic Light Emitting Devices in Flat Panel Display Applications, Society of Vacuum Coaters, 42nd Annual Technical Conference Proceedings, 1999, pp. 456–459.

Tropsha et al., "Activated Rate Theory Treatment of Oxygen and Water Transport through Silicon Oxide/Poly(ethylene terephthalate) Composite Barrier Structures," J. Phys. Chem B 1997, pp. 2259–2266.

Tropsha et al., "Combinatorial Barrier Effect of the Multilayer $SiO_x$ Coatings on Polymer Substrates," 1997 Society of Vacuum Coaters, 40th Annual Technical Conference Proceedings.

Phillips et al., "Evaporated Dielectric Colorless Films on PET and Opp Exhibiting High Barriers Toward Moisture and Oxygen," Society of Vacuum Coaters, 36th Annual Technical Conference Proceedings (1993), pp. 293–300.

* cited by examiner

Primary Examiner—Cynthia H. Kelly
Assistant Examiner—Tamra L Dicus
(74) Attorney, Agent, or Firm—Killworth, Gottman, Hagan & Schaeff, LLP

(57) ABSTRACT

A multilayer plastic substrate. The substrate comprises a plurality of thin film layers of at least one polymer, the plurality of thin film layers being adjacent to one another and having sufficient strength to be self-supporting, wherein the multilayer plastic substrate has an average visible light transmittance of greater than about 80%.

23 Claims, 1 Drawing Sheet

U.S. PATENT DOCUMENTS

| | | | |
|---|---|---|---|
| 4,581,337 A | | 4/1986 | Frey et al. |
| 4,624,867 A | | 11/1986 | Iijima et al. |
| 4,695,618 A | | 9/1987 | Mowrer |
| 4,842,893 A | | 6/1989 | Yializis et al. |
| 4,855,186 A | * | 8/1989 | Grolig et al. |
| 4,954,371 A | | 9/1990 | Yializis |
| 5,032,461 A | | 7/1991 | Shaw et al. |
| 5,237,439 A | | 8/1993 | Misono et al. |
| 5,260,095 A | | 11/1993 | Affinito |
| 5,354,497 A | | 10/1994 | Fukuchi et al. |
| 5,393,607 A | * | 2/1995 | Kawasaki et al. |
| 5,395,644 A | | 3/1995 | Affinito |
| 5,427,638 A | | 6/1995 | Goetz et al. |
| 5,440,446 A | | 8/1995 | Shaw et al. |
| 5,451,449 A | * | 9/1995 | Shetty et al. |
| 5,536,323 A | | 7/1996 | Kirlin et al. |
| 5,547,508 A | | 8/1996 | Affinito |
| 5,554,220 A | | 9/1996 | Forrest et al. |
| 5,576,101 A | | 11/1996 | Saitoh et al. |
| 5,607,789 A | | 3/1997 | Treger et al. |
| 5,620,524 A | | 4/1997 | Fan et al. |
| 5,629,389 A | | 5/1997 | Roitman et al. |
| 5,654,084 A | | 8/1997 | Egert |
| 5,660,961 A | * | 8/1997 | Yu .............................. 430/65 |
| 5,665,280 A | | 9/1997 | Tropsha |
| 5,681,615 A | | 10/1997 | Affinito et al. |
| 5,681,666 A | | 10/1997 | Treger et al. |
| 5,684,084 A | | 11/1997 | Lewin et al. |
| 5,686,360 A | | 11/1997 | Harvey, III et al. |
| 5,693,956 A | | 12/1997 | Shi et al. |
| 5,711,816 A | | 1/1998 | Kirlin et al. |
| 5,725,909 A | | 3/1998 | Shaw et al. |
| 5,731,661 A | | 3/1998 | So et al. |
| 5,747,182 A | | 5/1998 | Friend et al. |
| 5,757,126 A | | 5/1998 | Harvey, III et al. |
| 5,759,329 A | | 6/1998 | Krause et al. |
| 5,792,550 A | | 8/1998 | Phillips et al. |
| 5,811,177 A | | 9/1998 | Shi et al. |
| 5,811,183 A | | 9/1998 | Shaw et al. |
| 5,821,692 A | | 10/1998 | Rogers et al. |
| 5,844,363 A | | 12/1998 | Gu et al. |
| 5,872,355 A | | 2/1999 | Hueschen |
| 5,902,641 A | | 5/1999 | Affinito et al. |
| 5,902,688 A | | 5/1999 | Antoniadis et al. |
| 5,904,958 A | | 5/1999 | Dick et al. |
| 5,912,069 A | | 6/1999 | Yializis et al. |
| 5,919,328 A | | 7/1999 | Tropsha et al. |
| 5,922,161 A | | 7/1999 | Wu et al. |
| 5,945,174 A | | 8/1999 | Shaw et al. |
| 5,948,552 A | | 9/1999 | Antoniadis et al. |
| 5,955,161 A | | 9/1999 | Tropsha |
| 5,965,907 A | | 10/1999 | Huang et al. |
| 5,968,620 A | | 10/1999 | Harvey et al. |
| 5,996,498 A | | 12/1999 | Lewis |
| 6,013,337 A | | 1/2000 | Knors |
| 6,045,864 A | | 4/2000 | Lyons et al. |
| 6,083,628 A | | 7/2000 | Yializis |
| 6,092,269 A | | 7/2000 | Yializis et al. |
| 6,106,627 A | | 8/2000 | Yializis |
| 6,146,225 A | | 11/2000 | Sheats et al. |
| 6,165,566 A | | 12/2000 | Tropsha |
| 6,214,422 B1 | | 4/2001 | Yializis |
| 6,231,939 B1 | | 5/2001 | Shaw et al. |
| 6,322,860 B1 | * | 11/2001 | Stein et al. .................. 349/158 |
| 2002/0025444 A1 | * | 2/2002 | Hebgrink et al. |

FOREIGN PATENT DOCUMENTS

| | | | |
|---|---|---|---|
| EP | | 0 390 540 | 10/1990 |
| EP | | 0 547 550 | 6/1993 |
| EP | | 0 590 467 | 4/1994 |
| EP | | 0 722 787 | 7/1996 |
| EP | | 0 787 826 | 8/1997 |
| EP | | 0 916 394 | 5/1999 |
| EP | | 0 931 850 | 7/1999 |
| EP | | 0 977 469 | 2/2000 |
| EP | | 1 130 420 A | * 9/2001 |
| JP | | 63136316 | 6/1988 |
| JP | | 64-18441 | 1/1989 |
| JP | | 2-183230 | 7/1990 |
| JP | | 08325713 | 12/1996 |
| JP | | 09059763 | 3/1997 |
| WO | | WO 87 07848 | 12/1987 |
| WO | | WO 95 10117 | 4/1995 |
| WO | | WO 97 04885 | 2/1997 |
| WO | | WO 97 22631 | 6/1997 |
| WO | | WO 98 10116 | 3/1998 |
| WO | | WO 98 18852 | 5/1998 |
| WO | | WO 99 16557 | 4/1999 |
| WO | | WO 99 16931 | 4/1999 |
| WO | | WO 01 68360 A | * 9/2001 |

OTHER PUBLICATIONS

Chahroudi, Transparent Glass Barrier Coatings for Flexible Film Packaging, Society of Vacuum Coaters, 34th Annual Technical Conference Proceedings (1991), pp. 130–133.

Yamada et al., "The Properties of a New Transparent and Colorless Barrier Film," Society of Vacuum Coaters, 38th Annual Technical Conference Proceedings (1995), pp. 28–31.

Affinito, J.D., et al., "Vacuum Deposition of Polymer Electrolytes on Flexible Substrates," "Proceedings of the Ninth International Conference on Vacuum Web Coating," Nov. 1995 ed R. Bakish, Bakish Press 1995, pp. 20–36.

Vossen, J.L., et al., Thin Film Processes, Academic Press, 1978, Part II, Chapter 11–1, Glow Discharge Sputter Deposition, p. 12–63; Part IV, Chapter IV–1, Plasma Deposition of Inorganic Compounds and Chapter IV–2 Glow Discharge Polymerization, p. 335–397.

Penning, F.M., Electrical Discharges in Gasses, Gordon and Breach Science Publishers, 1965, Chapters 5–6, p. 19–35, and Chapter 8, p. 41–50.

Affinito, J.D., et al, "High Rate Vacuum Deposition of Polymer Electrolytes," Journal Vacuum Science Technology A 14(3), May/Jun. 1996.

Inoue et al., Fabrication of a Thin Film of MNA by Vapour Deposition, Proc. Jpn. Congr. Mater. Res., vol. 33, p. 177–9, 1990.

Affinito, J.D. et al., "PML/Oxide/PML Barrier Layer Performance Differences Arising From Use of UV or Electron Beam Polymerization of the PML Layers," Thin Solid Films, Elsevier Science S.A., vol. 308–309, Oct. 31, 1997, pp. 19–25.

Gustafsson, G. et al, "Flexible light–emitting diodes made from soluble conducting polymers," Nature, vol. 357, Jun. 11, 1992, pp. 447–479.

Affinito, J.D. et al., "Polymer–Oxide Transparent Barrier Layers," SVC 39th Annual Technical Conference, Vacuum Web Coating Session, 1996, pp. 392–397.

Affinito, J.D. et al, "PML/Oxide/PML Barrier Layer Performance Differences Arising From Use of UV or Electron Beam Polymerization of the PML Layers," SVC 40th Annual Technical Conference, 1997, pp. 19–25.

Wong, C.P., "Recent Advances in IC Passivation and Encapsulation: Process Techniques and Materials," Polymers for Electronic and Photonic Applications, AT&T Bell Laboratories, 1993, pp. 167–209.

De Gryse, R. et al., Sputtered Transparent Barrier Layers, pp. 190–198.

* cited by examiner

MULTILAYER PLASTIC SUBSTRATES

BACKGROUND OF THE INVENTION

The present invention relates generally to plastic substrates which may be useful in products including, but not limited to, visual display devices, and more particularly to multilayer plastic substrates having improved light transmittance.

As used herein, the term "(meth)acrylic" is defined as "acrylic or methacrylic." Also, (meth)acrylate is defined as "acrylate or methacrylate."

As used herein, the term "average visible light transmittance" means the average light transmittance over the visible range from 400 to 800 nm.

As used herein, the term "peak visible light transmittance" means the peak light transmittance over the visible range from 400 to 800 nm.

As used herein, the term "polymer precursor" includes monomers, oligomers, and resins, and combinations thereof. As used herein, the term "monomer" is defined as a molecule of simple structure and low molecular weight that is capable of combining with a number of like or unlike molecules to form a polymer. Examples include, but are not limited to, simple acrylate molecules, for example, hexanedioldiacrylate, or tetraethyleneglycoldiacrylate, styrene, methyl styrene, and combinations thereof. The molecular weight of monomers is generally less than 1000, while for fluorinated monomers, it is generally less than 2000. Monomers may be combined to form oligomers and resins but do not combine to form other monomers.

As used herein, the term "oligomer" is defined as a compound molecule of at least two monomers that maybe cured by radiation, such as ultraviolet, electron beam, or x-ray, glow discharge ionization, and spontaneous thermally induced curing. Oligomers include low molecular weight resins. Low molecular weight is defined herein as about 1000 to about 20,000 exclusive of fluorinated monomers. Oligomers are usually liquid or easily liquifiable. Oligomers do not combine to form monomers.

As used herein, the term "resin" is defined as a compound having a higher molecular weight (generally greater than 20,000) which is generally solid with no definite melting point. Examples include, but are not limited to, polystyrene resins, epoxy polyamine resins, phenolic resins, and acrylic resins (for example, polymethylmethacrylate), and combinations thereof.

There is a need for versatile visual display devices for electronic products of many different types. Although many current displays use glass substrates, manufacturers have attempted to produce commercial products, primarily liquid crystal display devices, using unbreakable plastic substrates. These attempts have not been completely successful to date because of the quality, temperature, and permeation limitations of polymeric materials. Flexible plastic substrates, such as polyethylene terephthalate (PET), polyethylene naphthalate (PEN), and polyether sulfone (PES), have been used in thicknesses from about 0.004 inches to 0.007 inches. However, the surface quality of these substrates is often poor, with the surface having large numbers of scratches, digs, pits, and other defects.

In addition, many polymers exhibit poor oxygen and water vapor permeation resistance, often several orders of magnitude below what is required for product performance. For example, the oxygen transmission rates for materials such polyethylene terephthalate (PET) are as high as 1550 $cc/m^2/day/micron$ of thickness (or 8.7 $cc/m^2/day$ for 7 mil thickness PET), and the water vapor transmission rates are also in this range. Certain display applications, such as those using organic light emitting devices (OLEDs), require encapsulation that has a maximum oxygen transmission rate of $10^{-4}$ to $10^{-2}$ $cc/m^2/day$, and a maximum water vapor transmission rate of $10^{-5}$ to $10^{-6}$ $g/m^2/day$.

Barrier coatings have been applied to plastic substrates to decrease their gas and liquid permeability. Barrier coatings typically consist of single layer thin film inorganic materials, such as Al, $SiO_x$, $AlO_x$, and $Si_3N_4$ vacuum deposited on polymeric substrates. A single layer coating on PET reduces oxygen permeability to levels of about 0.1 to 1.0 $cc/m^2/day$, and water vapor permeability to about 0.1 to 1.0 $g/m^2/day$. However, those levels are still insufficient for many display devices.

Additionally, many processes used in the manufacture of displays require relatively high temperatures that most polymer substrates cannot tolerate. For example, the recrystallization of amorphous Si to poly-Si in thin film transistors requires substrate temperatures of at least 160°–250° C., even with pulsed excimer laser anneals. The conductivity of a transparent electrode, which is typically made of indium tin oxide (ITO), is greatly improved if deposition occurs above 220° C. Polyimide curing generally requires temperatures of 250° C. In addition, many of the photolithographic process steps for patterning electrodes are operated in excess of 120° C. to enhance processing speeds in the fabrication. These processes are used extensively in the manufacture of display devices, and they have been optimized on glass and silicon substrates. The high temperatures needed for such processes can deform and damage a plastic substrate, and subsequently destroy the display. If displays are to be manufactured on flexible plastic materials, the plastic must be able to withstand the necessary processing conditions, including high temperatures over 100° C., harsh chemicals, and mechanical damage.

Thus, there is a need for an improved plastic substrate for visual display devices, and for a method of making such a substrate.

SUMMARY OF THE INVENTION

The present invention meets this need by providing a multilayer plastic substrate. The substrate consists essentially of a plurality of thin film layers of at least one polymer, the plurality of thin film layers being adjacent to one another and having sufficient strength to be self-supporting, wherein the multilayer plastic substrate has an average visible light transmittance of greater than about 80%. The average visible light transmittance is typically greater than about 85%, and it can be greater than about 90%. The peak visible transmittance is typically greater than about 85% and it can be greater than about 90%.

There are typically at least about 50 thin film layers. The number of layers depends on the thickness of the thin film layers and the desired overall thickness of the multilayer plastic substrate. The multilayer plastic substrate is typically at least about 0.001 inches thick, and generally at least about 0.004 inches thick. Each thin film layer is typically less than about 50 μm thick.

Polymers include, but are not limited to (meth)acrylate-containing polymers, styrene containing polymers, methyl styrene containing polymers, and fluorinated polymers, and combinations thereof. The glass transition temperature of the at least one polymer is generally greater than about 150° C., and it may be greater than about 200° C.

The surface roughness of the multilayer plastic substrate is generally less than about 10 nm, and it may be less than about 5 nm, or less than about 2 nm.

The multilayer plastic substrate can have a refractive index of greater than about 1.4 or greater than about 1.5.

The multilayer plastic substrate can include additional layers, including, but not limited to, scratch resistant layers, antireflective coatings, antifingerprint coatings, antistatic coatings, conductive coatings, transparent conductive coatings, and barrier coatings, to provide functionality to the substrate if desired.

Another aspect of the invention involves a method of making the multilayer plastic substrate. The method includes providing a support, depositing a plurality of thin film layers of at least one polymer on the support so that the plurality of thin film layers have sufficient strength to be self-supporting to form the multilayer substrate, and removing the support from the multilayer substrate, wherein the multilayer plastic substrate has an average visible light transmittance of greater than about 80%.

The thin film layers can be deposited in a vacuum. One example of a vacuum deposition process is flash evaporation. In this method, depositing the plurality of thin film layers includes flash evaporating a polymer precursor, condensing the polymer precursor as a liquid film, and cross-linking the polymer precursor to form the polymer. The polymer precursor can be cross-linked by any suitable method, including, but not limited to, radiation curing, such as ultraviolet, electron beam, or x-ray, glow discharge ionization, and spontaneous thermally induced curing.

Alternatively, the plurality of thin film layers can be deposited by extruding or casting a layer of polymer precursor, and cross-linking the polymer precursor to form the polymer using any suitable cross-linking method.

Accordingly, it is an object of the present invention to provide an improved, multilayer plastic substrate and to provide a method of making such a substrate.

DESCRIPTION OF THE INVENTION

Figure 1:
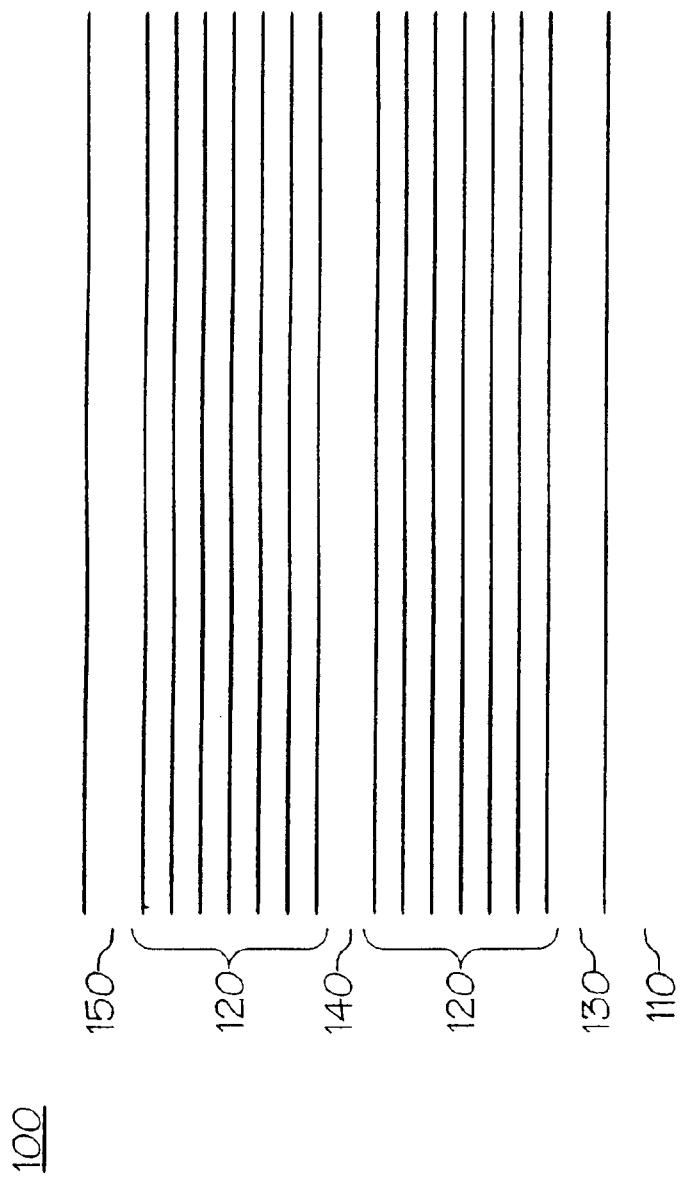
FIG. 1 is a cross-section of one embodiment of the substrate of the present invention.

FIG. 1 shows one embodiment of a multilayer plastic substrate of the present invention. The multilayer plastic substrate 100 is formed on a support 110. After the multilayer plastic substrate is formed, the support 110 is removed.

The multilayer plastic substrate of the present invention consists essentially of a plurality of thin film layers 120 of at least one polymer adjacent to one another. By adjacent, we mean next to, but not necessarily directly next to. In most of the multilayer plastic substrate, the polymer thin film layers will be directly next to one another. However, there can be additional layers intervening between some adjacent layers in order to provide additional functionality to the multilayer plastic substrate, as shown in FIG. 1 and described below.

The plurality of thin film layers have sufficient strength to be self-supporting after they are formed. The exact number of thin film layers is not critical. It depends on the thickness of each of the individual thin film layers and the desired overall thickness of the multilayer plastic substrate. There must be enough thin film layers so that the plurality of thin film layers have sufficient strength to be self-supporting. As used herein, the term self-supporting means the substrate can be handled and processed without the need for an underlying support once the plurality of thin film layers have been deposited. There are typically at least about 50 thin film layers, more typically at least about 100 thin film layers. There are generally in the range of about 500 thin film layers to about 1000 thin film layers or more. Each thin film layer is typically between about 0.05 to about 2 $\mu$m thick, generally between about 0.2 to about 0.3 $\mu$m. If the thin film layers are extruded, they are usually thicker, typically up to about 50 $\mu$m thick, in that case. The multilayer plastic substrate is typically at least about 0.001 inches thick, and generally at least about 0.004 inches thick. A 0.007 inch thick substrate would require about 90 to 350 passes of the web past the polymer precursor sources. The multilayer plastic substrate can be flexible or rigid.

The average visible light transmittance of the multilayer plastic substrate is greater than about 80%, generally greater than 85%, and it may be greater than 90%. The peak visible light transmittance is generally greater than 85%, and it may be greater than 90%.

The at least one polymer can be any suitable polymer, including, but not limited to, polymers made from styrene polymer precursors, polymers made from methyl styrene polymer precursors, polymers made from (meth)acrylate polymer precursors, for example, polymers made from hexanedioldiacrylate or tetraethyleneglycoldiacrylate polymer precursors, and fluorinated polymers, and combinations thereof. Polymers made from (meth)acrylate polymer precursors work well.

The multilayer plastic substrate can be flexible or rigid. Multilayer plastic substrates made from polymers including, but not limited to, (meth)acrylate polymer precursors will be flexible. One advantage of multilayer laminated materials is that they typically have greater strength and flexibility than comparable single layer substrates. A multilayer plastic substrate of the present invention generally has hundreds of cross-linked layers that provide mechanical strength and sufficient rigidity to support the circuitry and devices on the display.

A multilayer plastic substrate made from (meth)acrylate polymer precursors will have excellent transmission at visible wavelengths. Because polymers made from (meth)acrylate polymer precursors have very low optical absorption, a multilayer plastic substrate made entirely from such polymers will have high optical transparency, typically an average visible light transmittance of greater than about 90%. Multilayer substrates made entirely from fluorinated polymers will also have an average visible light transmittance of greater than 90%. Substrates made from styrene and methyl styrene polymers would have an average visible light transmittance of about 89%.

The birefringence present in many flexible substrates can be reduced or eliminated with the present invention because the multilayer plastic substrate is not mechanically stressed during deposition.

Fully cured layers of polymers made from (meth)acrylate polymer precursors generally have a refractive index of greater than about 1.5, while fully cured fluorinated polymers generally have a refractive index of greater than about 1.4. Styrene containing polymers would have a refractive index of about 1.6.

Many optical applications, such as mirrors and reflectors, and display applications, such as organic light emitting devices, require substrates with a surface roughness of less than 2 nm. Surface roughness is the root mean square of peak-to-valley measurement over a specified distance, usually 1 nm. It can be measured using an atomic force microscope or back reflection distribution function. Many substrates do not have the necessary surface smoothness. For example, the surface roughness of PET is about 20–50 nm with 100 nm spikes. In contrast, flash evaporated polymer coatings have a very low surface roughness, generally less than about 10 nm, and it may be less than 5 nm, or less than about 2 nm. Surface roughness on the order of 1 nm has been demonstrated. The surface of the multilayer plastic substrate is specular because of the exceptional smoothness of the polymer layers.

Because the polymer material is highly cross-linked, the multilayer plastic substrate can have a high glass transition temperature and excellent chemical resistance. The glass transition temperature of the at least one polymer is generally greater than about 150° C., and may be greater than about 200° C.

Polymers including, but not limited to, (meth)acrylates, polycarbonates, polysulfones, polyethersulfones, polymides, polyamides, and polyether naphthenates have demonstrated excellent resistance to solvents. This provides protection from processing chemicals, ultraviolet light exposure, and photoresists during lithography processes used to manufacture flat panel displays and their devices.

The thin film layers that form the multilayer substrate can be deposited by any suitable method, including vacuum flash evaporation, extrusion, or casting. With vacuum flash evaporation, deposition can be performed using a rotating drum or strap configuration. The polymer precursor is degassed and metered into a hot tube where it flash evaporates and exits through a nozzle as a polymer precursor gas.

The flash evaporating may be performed by supplying a continuous liquid flow of the polymer precursor into a vacuum environment at a temperature below both the decomposition temperature and the polymerization temperature of the polymer precursor, continuously atomizing the polymer precursor into a continuous flow of droplets, and continuously vaporizing the droplets by continuously contacting the droplets on a heated surface having a temperature at or above a boiling point of the liquid polymer precursor, but below a pyrolysis temperature, forming the evaporate. The droplets typically range in size from about 1 micrometer to about 50 micrometers, but they could be smaller or larger.

Alternatively, the flash evaporating may be performed by supplying a continuous liquid flow of the polymer precursor into a vacuum environment at a temperature below both the decomposition temperature and the polymerization temperature of the polymer precursor, and continuously directly vaporizing the liquid flow of the polymer precursor by continuously contacting the liquid polymer precursor on a heated surface having a temperature at or above the boiling point of the liquid polymer precursor, but below the pyrolysis temperature, forming the evaporate. This may be done using the vaporizer disclosed in U.S. Pat. Nos. 5,402,314, 5,536,323, and 5,711,816, which are incorporated herein by reference.

The polymer precursor then condenses on the support as a liquid film which is subsequently cross-linked to form a polymer by any suitable method, including, but not limited to, radiation, such as ultraviolet, electron beam, or x-ray, glow discharge ionization, and spontaneous thermally induced curing. This process is capable of depositing thousands of polymer layers at web speeds up to 100 m/min.

Alternatively, after degassing, the polymer precursor can be deposited by extruding, spraying, or casting layers of polymer precursor on the support. The polymer precursor is then cross-linked using any suitable method, such as those described above.

The functionality of the multilayer plastic substrate can be increased by the incorporation of functional layers 130, 140, and 150 during the deposition process. These functional layers 130, 140, and 150 can be deposited at any time during the deposition process. They can be deposited below, 130, in between, 140, or on top of, 150, the plurality of thin film layers 120 of the multilayer plastic substrate, as shown in FIG. 1. As used herein, depositing a coating adjacent to the multilayer plastic substrate includes: depositing the coating on the top layer of the multilayer plastic coating; depositing the coating on the multilayer plastic substrate and then depositing additional layers of the multilayer plastic substrate over the coating so that the coating is between the layers of the multilayer plastic substrate; and depositing the coating first and then depositing the layers of the multilayer plastic substrate, and combinations thereof. Functional layers 130, 140, and 150 include, but are not limited to, scratch resistant coatings, antireflective coatings, antifingerprint coatings, antistatic coatings, conductive coatings, transparent conductive coatings, and barrier coatings, and other functional layers. Depositing these additional layers allows the multilayer plastic substrate to be specifically tailored to different applications. Little or no surface modification is necessary for deposition of other layers because of the very smooth surface of the multilayer plastic substrate. Interfaces can be graded to bond all integrated functional layers firmly during the same coating run and pumpdown.

For some applications, it may be important that the presence of functional layers not reduce the average visible light transmittance below 80%, for others, not below 85%, and still others, not below 90%. In others, it may be important that the peak visible light transmittance not drop below 85%, and for others, not below 90%. In others, it may be important that the functional layers not increase the surface roughness to greater than about 10 nm, for others, not greater than about 5 nm, and for others, not greater than 2 nm.

One type of functional layer that can be included is a barrier coating. One example of a barrier coating is described in application Ser. No. 09/427,138, filed Oct. 25, 1999, entitled "Environmental Barrier Material for Organic Light Emitting Device and Method of Making," which is incorporated herein by reference. The barrier coating can be a barrier stack having one or more barrier layers and one or more polymer layers. There could be one polymer layer and one barrier layer, there could be one or more polymer layers on one side of one or more barrier layers, or there could be one or more polymer layers on both sides of one or more barrier layers. The important feature is that the barrier stack have at least one polymer layer and at least one barrier layer. The barrier layers and polymer layers in the barrier stack can be made of the same material or of a different material. The barrier layers are typically in the range of about 100–400 Å thick, and the polymer layers are typically in the range of about 1000–10,000 Å thick.

The number of barrier stacks is not limited. The number of barrier stacks needed depends on the material used for the polymer of the substrate and the level of permeation resistance needed for the particular application. One or two barrier stacks should provide sufficient barrier properties for some applications. The most stringent applications may require five or more barrier stacks.

The barrier layers should be transparent. Transparent barrier materials include, but are not limited to, metal oxides, metal nitrides, metal carbides, metal oxynitrides, metal oxyborides, and combinations thereof The metal oxides include, but are not limited to, silicon oxide, aluminum oxide, titanium oxide, indium oxide, tin oxide, indium tin oxide, tantalum oxide, zirconium oxide, niobium oxide, and combinations thereof. The metal carbides include, but are not limited to, boron carbide, tungsten carbide, silicon carbide, and combinations thereof. The metal nitrides include, but are not limited to, aluminum nitride, silicon nitride, boron nitride, and combinations thereof. The metal oxynitrides include, but are not limited to, aluminum oxynitride, silicon oxynitride, boron oxynitride, and combinations thereof. The metal oxyborides include, but are not limited to, zirconium oxyboride, titanium oxyboride, and combinations thereof.

The polymer layers of the barrier stacks can be made from (meth)acrylate polymer precursors. The polymer layers in the barrier stacks can be the same or different.

The barrier stacks can be made by vacuum deposition. The barrier layer can be vacuum deposited onto, or into, the multilayer plastic substrate, or another functional layer. The polymer layer is then deposited on the barrier layer, preferably by flash evaporating (meth)acrylate polymer precursors, condensing on the barrier layer, and polymerizing in situ in a vacuum chamber. U.S. Pat. Nos. 5,440,446 and 5,725,909, which are incorporated herein by reference, describe methods of depositing thin film, barrier stacks.

Vacuum deposition includes flash evaporation of (meth) acrylate polymer precursors with in situ polymerization under vacuum, plasma deposition and polymerization of (meth)acrylate polymer precursors, as well as vacuum deposition of the barrier layers by sputtering, chemical vapor deposition, plasma enhanced chemical vapor deposition, evaporation, sublimation, electron cyclotron resonance-plasma enhanced vapor deposition (ECR-PECVD), and combinations thereof.

In order to protect the integrity of the barrier layer, the formation of defects and/or microcracks in the deposited layer subsequent to deposition and prior to downstream processing should be avoided. The multilayer plastic substrate is preferably manufactured so that the barrier layers are not directly contacted by any equipment, such as rollers in a web coating system, to avoid defects that may be caused by abrasion over a roll or roller. This can be accomplished by designing the deposition system such that the barrier layers are always covered by polymer layers prior to contacting or touching any handling equipment.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A multilayer plastic substrate consisting essentially of:
a plurality of flash evaporated thin film layers of at least one polymer, the plurality of thin film layers being adjacent to one another and having sufficient strength to be self-supporting, wherein the multilayer plastic substrate has an average visible light transmittance of greater than about 80%, wherein the multilayer plastic substrate comprises at least about 50 thin film layers, and wherein the multilayer plastic substrate has a surface roughness of less than about 10 nm.

2. The multilayer plastic substrate of claim 1 wherein the average visible light transmittance is greater than about 85%.

3. The multilayer plastic substrate of claim 1 wherein the average visible light transmittance is greater than about 90%.

4. The multi layer plastic substrate of claim 1 wherein the peak visible light transmittance is greater than about 85%.

5. The multilayer plastic substrate of claim 1 wherein the peak visible light transmittance is greater than about 90%.

6. The multilayer plastic substrate of claim 1, wherein the multilayer plastic substrate comprises at least about 100 thin film layers.

7. The multilayer plastic substrate of claim 6, wherein the multilayer plastic substrate comprises at least about 500 thin film layers.

8. The multilayer plastic substrate of claim 7, wherein the multilayer plastic substrate comprises at least about 1000 thin film layers.

9. The multilayer plastic substrate of claim 1, wherein the multilayer plastic substrate is at least about 0.001 inches thick.

10. The multilayer plastic substrate of claim 1, wherein the multilayer plastic substrate is at least about 0.004 inches thick.

11. The multilayer plastic substrate of claim 1, wherein each thin film layer is less than about 50 $\mu$m thick.

12. The multilayer plastic substrate of claim 1, wherein each thin film layer is less than about 5 $\mu$m thick.

13. The multilayer plastic substrate of claim 1, wherein each thin film layer is in the range of about 0.05 to about 2 $\mu$m thick.

14. The multilayer plastic substrate of claim 1, wherein each thin film layer is in the range of about 0.2 to about 0.3 $\mu$m thick.

15. The multilayer plastic substrate of claim 1, wherein the at least one polymer is selected from (meth)acrylates, polystyrenes, methyl styrene-containing polymers, fluorinated polymers, polycarbonates, polysulfones, polyethersulfones, polyimides, polyamides, and polyether naphthenates, and combinations thereof.

16. The multilayer plastic substrate of claim 1, wherein the glass transition temperature of the at least one polymer is greater than about 150° C.

17. The multilayer plastic substrate of claim 1, wherein the glass transition temperature of the at least one polymer is greater than about 200° C.

18. The multilayer plastic substrate of claim 1, wherein the multilayer plastic substrate has a surface roughness of less than about 2 nm.

19. The multilayer plastic substrate of claim 1, wherein the multilayer plastic substrate has a refractive index of greater than about 1.5.

20. The multilayer plastic substrate of claim 1, wherein the multilayer plastic substrate has a refractive index of greater than about 1.4.

21. The multilayer plastic substrate of claim 1, wherein the multilayer plastic substrate is flexible.

22. The multilayer plastic substrate of claim 1, wherein the multilayer plastic substrate is rigid.

23. The multilayer plastic substrate of claim 1, wherein the multilayer plastic substrate has a surface roughness of less than about 5 nm.

* * * * *

UNITED STATES PATENT AND TRADEMARK OFFICE
CERTIFICATE OF CORRECTION

PATENT NO. : 6,623,861 B2
DATED : September 23, 2003
INVENTOR(S) : Martin et al.

It is certified that error appears in the above-identified patent and that said Letters Patent is hereby corrected as shown below:

Column 6,
Line 66, "combinations thereof The" should be -- combinations thereof. The --

Signed and Sealed this

Fifth Day of October, 2004

JON W. DUDAS
*Director of the United States Patent and Trademark Office*